United States Patent [19]
Odagawa et al.

[11] Patent Number: 6,160,266
[45] Date of Patent: *Dec. 12, 2000

[54] SUPERCONDUCTING DEVICE AND A METHOD OF MANUFACTURING THE SAME

[75] Inventors: Akihiro Odagawa, Nara; Hideaki Adachi; Kentaro Setsune, both of Osaka, all of Japan

[73] Assignee: Matsushita Electric Industrial Co., Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/803,940

[22] Filed: Feb. 20, 1997

[30] Foreign Application Priority Data

Feb. 22, 1996 [JP] Japan ..................... 8-034558

[51] Int. Cl.[7] ................................. H01L 29/06
[52] U.S. Cl. ................................. 257/36; 257/39
[58] Field of Search ................ 257/30, 31, 32, 257/33, 34, 35, 36, 37, 38, 39

[56] References Cited

U.S. PATENT DOCUMENTS

| | | | |
|---|---|---|---|
| 5,196,395 | 3/1993 | James et al. ........................ | 505/1 |
| 5,358,928 | 10/1994 | Ginley et al. ...................... | 525/192 |
| 5,422,497 | 6/1995 | Saitoh et al. ...................... | 257/35 |
| 5,510,324 | 4/1996 | Nakamura et al. ............... | 505/330 |
| 5,512,151 | 4/1996 | Hayamizy et al. ............ | 204/192.15 |
| 5,552,374 | 9/1996 | Tanaka et al. ..................... | 505/193 |
| 5,612,290 | 3/1997 | Tanaka et al. ..................... | 505/190 |
| 5,627,139 | 5/1997 | Chin et al. ......................... | 505/238 |

FOREIGN PATENT DOCUMENTS

| | | |
|---|---|---|
| 4-137682 | 5/1992 | Japan . |
| 4-163808 | 6/1992 | Japan . |
| 5-48167 | 2/1993 | Japan . |

*Primary Examiner*—Olik Chaudhuri
*Assistant Examiner*—Douglas A. Wille
*Attorney, Agent, or Firm*—Morrison & Foerster LLP

[57] ABSTRACT

This invention provides a superconducting device with good characteristics that can be reproduced at an arbitrary place on a substrate and a method of manufacturing the same. A convex region (a processed, linearly shaped platinum thin film) of oriented metal is provided on a substrate as a gate electrode. Then, an oxide insulating film ($SrTiO_3$ thin film) is deposited on the convex region, and further a $YBa_2Cu_3O_7$ oxide superconducting thin film is deposited on the oxide insulating film. Accordingly, a grain boundary part is formed on the convex region. A drain electrode and a source electrode are formed facing each other with the grain boundary part between.

18 Claims, 4 Drawing Sheets

SUPERCONDUCTING DEVICE AND A METHOD OF MANUFACTURING THE SAME

FIELD OF THE INVENTION

This invention is related to a superconducting device utilizing superconductivity application techniques and a method of manufacturing the same. More particularly, it is related to a superconducting device using oxide superconductors and the method of manufacturing the same.

BACKGROUND OF THE INVENTION

When a device having a Josephson junction that is the base of a superconducting device is produced, it is necessary to precisely form a tunnel layer as a barrier. Superconducting coherence length at the interface of a tunnel layer and a superconductor is an important parameter to control to precisely form a tunnel layer in manufacturing a superconducting device.

Superconducting devices having Josephson junctions can be classified into two large groups: laminated type and flat type. Because the superconductive properties of an oxide superconductor that constitutes a superconducting device are sensitive to the crystal structure and composition, deteriorated layers may be produced due to defects at the junction interface. In such a case, if the coherence length is short, good junction properties cannot be obtained. In regard to a c-axis oriented thin film, which is widely used in laminated type devices, because the coherence length in the direction of the c-axis is short, forming a tunnel junction is difficult. Therefore there have been a reproducibility problems in the forming process.

Furthermore, in the field of superconducting devices, an integrated device is expected to achieve. In an integrated superconducting device, it is known that consistency among the properties of Josephson junctions affects the sensitivity of the device.

In view of the problems described above, research concerning reproducibility has been actively continued. In this respect, flat type devices using grain boundary junctions formed on a bicrystal substrate having one-dimensional grain boundary thereon have good reproducibility, and Josephson junctions can be formed relatively easily in this type of device. However, since the location to form a superconducting device is fixed in this type of device, there have been problems in the integrating process. Therefore, there have been problems in both laminated type devices and flat type devices for practical use.

SUMMARY OF THE INVENTION

The invention provides a superconducting device with good characteristics which can be reproduced at an arbitrary place on a substrate and a method of manufacturing the same.

In particular, the invention provides a superconducting device that includes a substrate, a convex region formed on the substrate, an oxide film formed on the substrate and the convex region, and an oxide superconducting film formed on the oxide film. According to the structure of the superconducting device, it is possible to reproduce a superconducting device with good characteristics at an arbitrary position on the substrate by providing the convex region at the position.

Furthermore, in the structure of a superconducting device of the invention, the convex region is preferably of oriented metal. In one embodiment, an oxide film and a superconducting film having good crystal structures can be formed on the convex region, so that a superconducting device with good characteristics can be produced relatively easily. Furthermore, in this case, the oriented metal is preferably platinum.

Furthermore, the convex region in the superconducting device of the invention is preferably linearly shaped.

Also, the oxide film in the superconducting device of the invention is preferably an insulating layer.

According to a superconducting device having the structure described above, by using an oriented metal (thin metal film) for the linear convex region, it is possible to use said metal (thin metal film) as an electrode for applying an electric field. As such, an electric field effect device that controls carriers in the grain boundary junction part can be produced.

The first manufacturing method of a superconducting device of this invention, which comprises a substrate, a convex region formed on the substrate, an oxide film formed on the substrate and the convex region, and an oxide superconducting film formed on the oxide film, comprises a process in which said oxide film and said oxide superconducting film are oriented. According to this method, it is possible to form a grain boundary in the oxide superconducting film on the convex region, so that a device having a Josephson junction can be produced relatively easily.

Furthermore, in one method of manufacturing a superconducting device of the invention, high temperature annealing may be conducted after the oxide superconducting film is deposited on the substrate and the convex region. According to this method, not only can the crystal structure and the superconductivity of the oxide superconducting film be improved, but also an oxide layer of high resistance can be formed at the interface between the oxide superconducting film and the convex region, so that insulation between the convex region of metal and the oxide superconducting film can be easily provided. Furthermore, in this case, the oxide film and the oxide superconducting film are preferably prepared as, precursors either in polycrystalline or amorphous state. According to this method, a device having a large grain size, high superconductivity and high grain boundary resistance can be obtained through high temperature annealing.

Epitaxial growth of the oxide film and the oxide superconducting film may be caused successively on the substrate and the convex region. This permits the thickness and the properties of the channel layer of an electric field effect device to be easily controlled, so that the device can be easily manufactured.

To manufacture a second manufacturing method of a superconducting device that includes a substrate, a convex region formed on the substrate, an oxide film formed on the substrate and the convex region, and an oxide superconducting film formed on the oxide film. The convex region is formed by applying an electric field between the tip of the probe capable of scanning and the surface of the substrate. According to this method, a superconducting device having a Josephson junction is produced by the steps of applying an electric field between the probe capable of scanning and the surface of the substrate, forming a convex region by inducing atoms on the surface of the substrate, and depositing an oxide superconductor on the convex region.

DETAILED DESCRIPTION

The invention is explained in further detail with reference to the following embodiments. Although typical embodiments are described in the following, it does not limit this invention in any way.

(EMBODIMENT 1)

Figure 1:
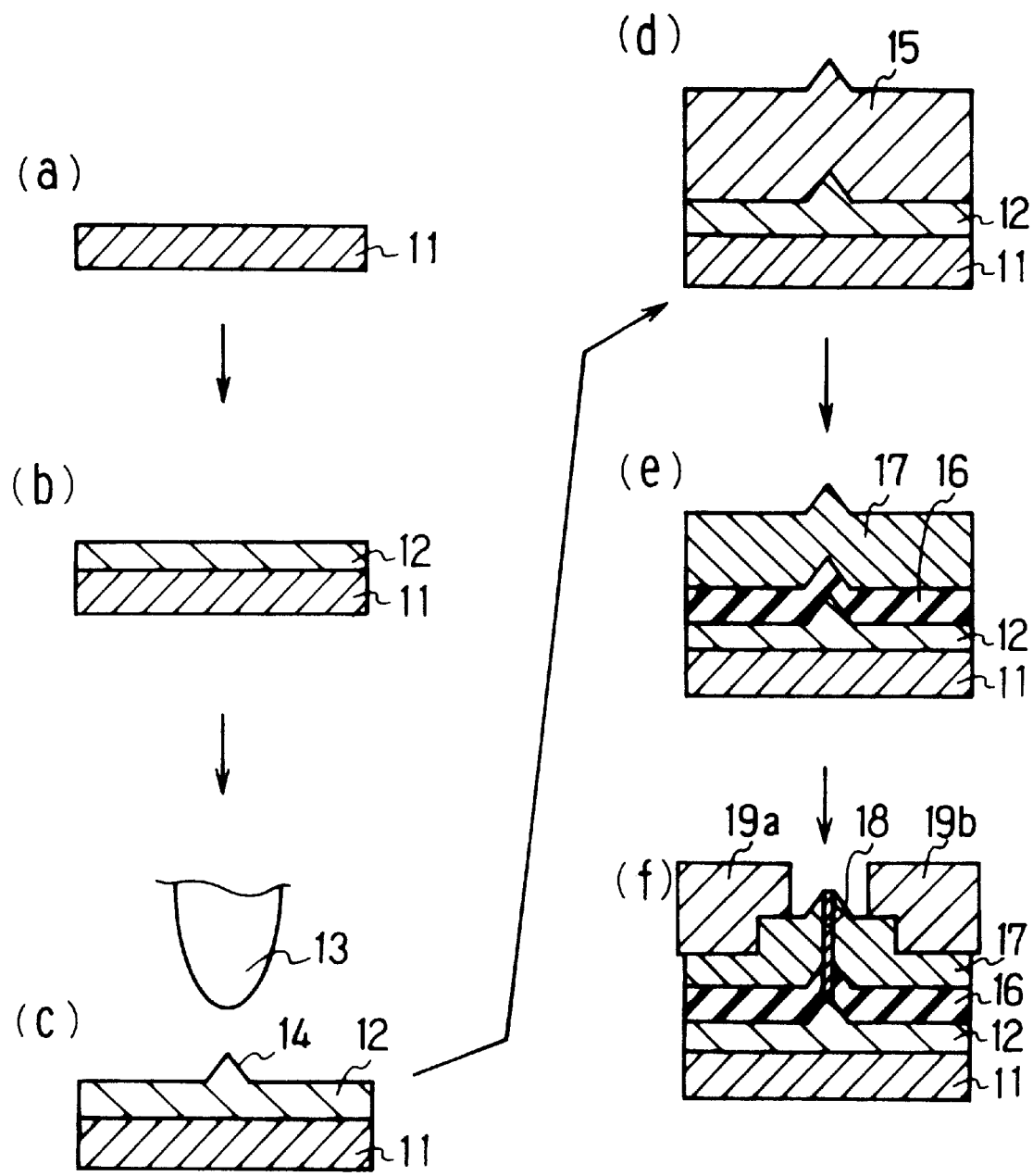
FIGS. 1(a)–1(f) are cross-sectional views showing the manufacturing processes of a superconducting device in a first embodiment of the invention.

FIG. 1 shows cross-sections showing manufacturing processes of a superconducting device in the first embodiment of the invention. The manufacturing processes of a superconducting device are explained in the following with reference to FIG. 1(a) to FIG. 1(f).

FIG. 1(a) shows a substrate 11 which constitutes a superconducting device in this embodiment. For example, a $SrTiO_3$ monocrystal substrate can be used as the substrate 11.

In the process shown by FIG. 1(b), a platinum thin film 12 having a thickness of about 100 nm was deposited on the substrate 11 at a temperature of 500° C. with the substrate 11 in an argon atmosphere of 60 m Torr (about 8.0 Pa). The resulting platinum thin film 12 was oriented to the (100) crystal plane. It is to be understood that the substrate formed in this process (the platinum thin film 12 having a thickness of about 100 nm formed on the substrate 11) is hereinafter referred to as the "thin film substrate".

Next, in the process shown by FIG. 1(c), by using a scanning tunneling microscope, tunnel current of 2 nA was passed and bias voltage of −4 V was applied between the probe 13 of the microscope and the surface of the thin film substrate. By this process, atoms on the surface of the thin film substrate were induced, and a line shaped convex region 14 was formed on the thin film substrate. The probe 13 of the scanning tunneling microscope used in this example may be made of gold or platinum. It was observed that a convex region having a triangular shape in section was formed on the processed region (the region processed in this step) by using an atomic force microscope (AFM). It was determined that the processed convex region 14 was about 250 nm in width and about 10 nm in height by scanning with the probe 13. The substrate formed in this process is hereinafter referred to as the "processed substrate".

Next, in the process shown by FIG. 1(d), the precursor 5 of a $Bi_2Sr_2CaCu_2O_x$ oxide superconducting thin film in polycrystal or amorphous state having a thickness of about 200 nm was formed on the processed substrate by sputtering. Then, the precursor of the oxide superconducting thin film 15 was oriented by conducting high temperature annealing in an atmosphere of mixture of oxygen and nitrogen (containing 2% to 15% of oxygen) at a temperature of about 800° C. to 850° C. FIG. 1(e) shows the state after this process. That is, FIG. 1(e) shows that an oriented oxide superconducting thin film 17 was formed by high temperature annealing. In this state, it was observed that an oxide thin film layer 16 of high resistance was formed between the platinum thin film 12 and the oriented oxide superconducting thin film 17. Furthermore, it was observed that a grain boundary 18 was formed on the convex region 14.

Then, in the process shown by FIG. 1(f), after forming a superconducting bridge with a wiring pattern of 1 μm in width and 10 μm in length to cross the convex region by an etching technique using photolithography and Ar ions so that the grain boundary part 18 became a grain boundary type Josephson junction, metallic electrodes for wiring 19a, 19b were formed, producing a superconducting device. The metalic electrodes for wiring 19a, 19b were formed facing each other with the grain boundary 18 formed in between on the convex region 14. The metallic electrodes for wiring 19a, 19b and the convex region 14 on the platinum thin film 12 function as electrodes of the superconducting device. For example, the metallic electrode for wiring 19a functions as a drain electrode, the metallic electrode for wiring 19b functions as a source electrode, and the convex region 14 on the platinum thin film 12 functions as a gate electrode.

Figure 2:
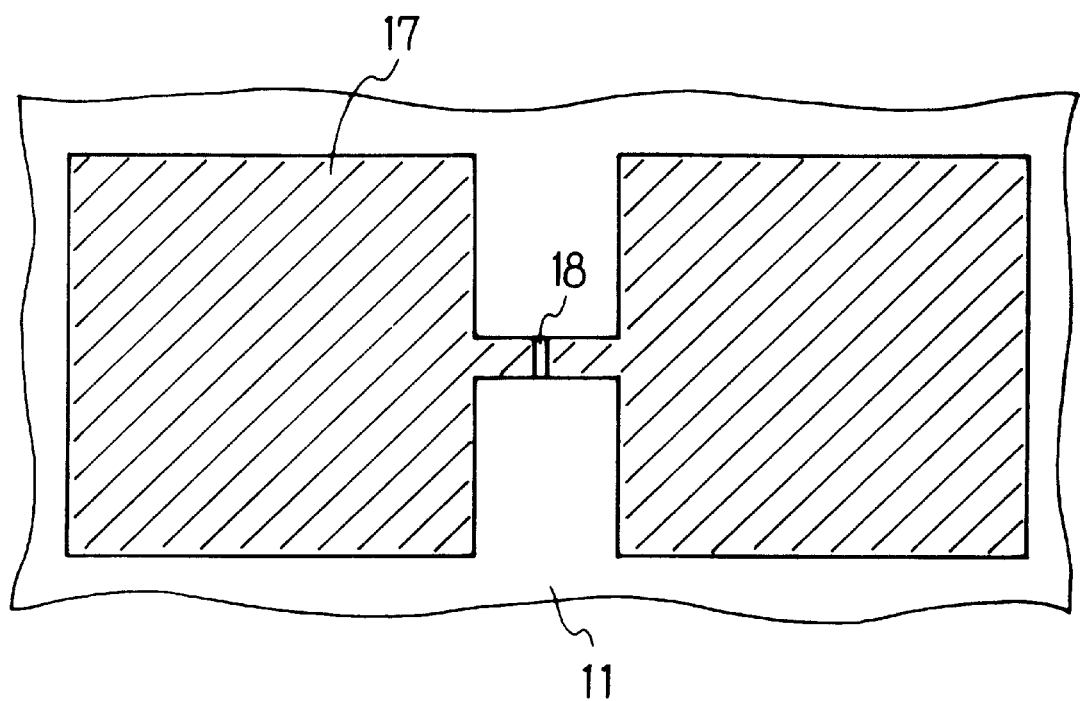
FIG. 2 is a plan view showing the shape of a superconducting device of the first embodiment of the invention.

FIG. 2 is a plan view showing the shape of a superconducting device in this embodiment which was formed by the above described processes. As is apparent from FIG. 2, the oriented oxide superconducting thin film 17 was formed on the substrate 11, and the grain boundary part 18 became a grain boundary type Josephson junction.

Figure 3:
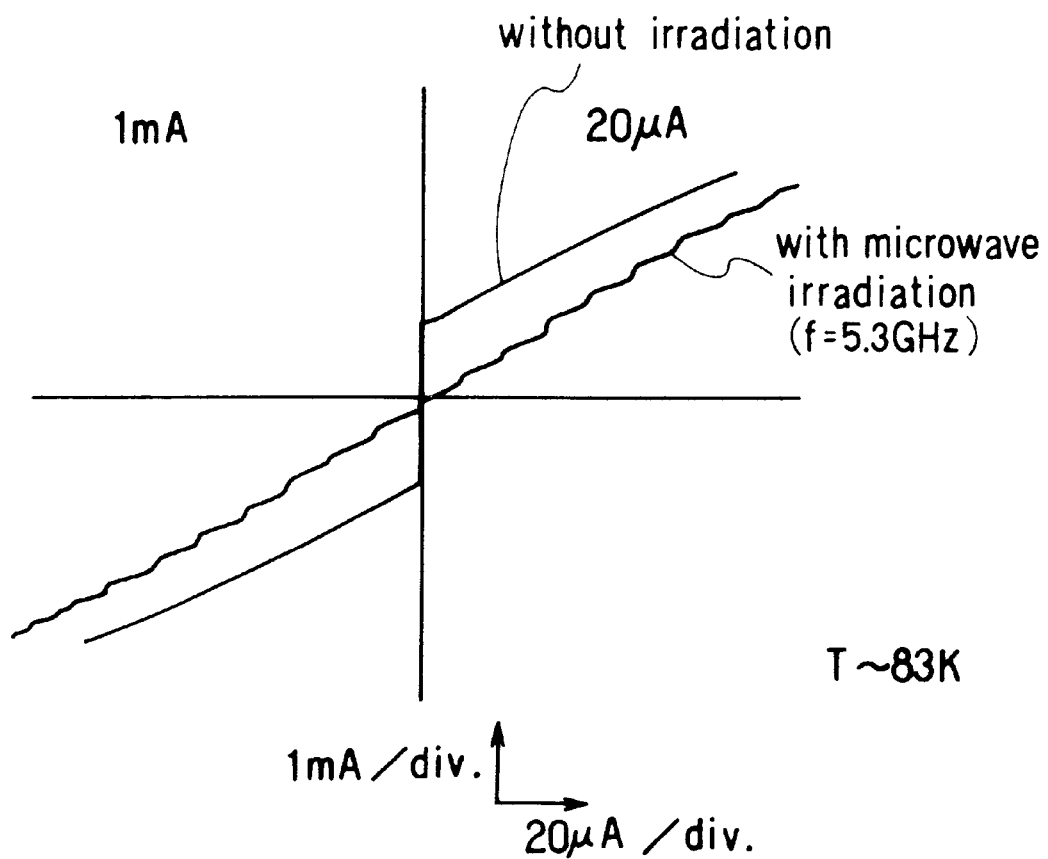
FIG. 3 shows the current-voltage characteristics of the superconducting device of FIG. 2.

FIG. 3 shows the current-voltage characteristics of a superconducting device in this embodiment. As is shown by FIG. 3, typical Shapiro steps were observed when microwave was irradiated to a superconducting device of this embodiment at a temperature of about 83 K. Accordingly, it was confirmed that a Josephson junction device was obtained.

According to the manufacturing method of a superconducting device in the embodiment described above, it is possible to form a grain boundary in the oxide superconducting thin film on the convex region 14, therefore a superconducting device having a Josephson junction can be relatively easily produced. In addition, by conducting high temperature annealing after depositing the oxide superconducting thin film 16 on the platinum thin film 12 on which the convex region 14 is formed, the crystal structure and the superconductivity of the oxide superconducting thin film can be improved, and also the oxide thin film layer 16 of high resistance can be formed between the platinum thin film 12 and the oxide superconducting thin film 17. Therefore, insulation between the platinum thin film 12 and the oxide superconducting thin film 17 can be easily provided.

Furthermore, having described in this embodiment a method of manufacturing a Josephson junction device in which the precursor of a $Bi_2Sr_2CaCu_2O_x$ oxide superconducting thin film 15 in polycrystalline or amorphous state was formed by sputtering on the substrate on which the convex region 14 was formed as an example, this invention is not limited to this method. For example, a Josephson junction device can be produced by the following steps. First, a $Bi_2Sr_2CuO_y$ oxide thin film showing semiconductive conductivity is deposited by sputtering on a substrate on which a convex region is formed. Then, a c-axis oriented $Bi_2Sr_2CaCu_2O_x$ oxide superconducting thin film is formed by sputtering at a substrate temperature of 650° C. in an atmosphere of mixture of argon and oxygen (containing 10% to 25% of oxygen) of 7.5 m Torr (about 1.0 Pa) without high temperature annealing. It was observed that the resulting Josephson junction device showed Josephson effect. However, in comparing $I_c \cdot R_n$, which is the product of the critical current and the junction resistance, that of the device produced with high temperature annealing was about 1.5 mV, about twice as much as that of the device produced without high temperature annealing.

(Embodiment 2)

Figure 4:
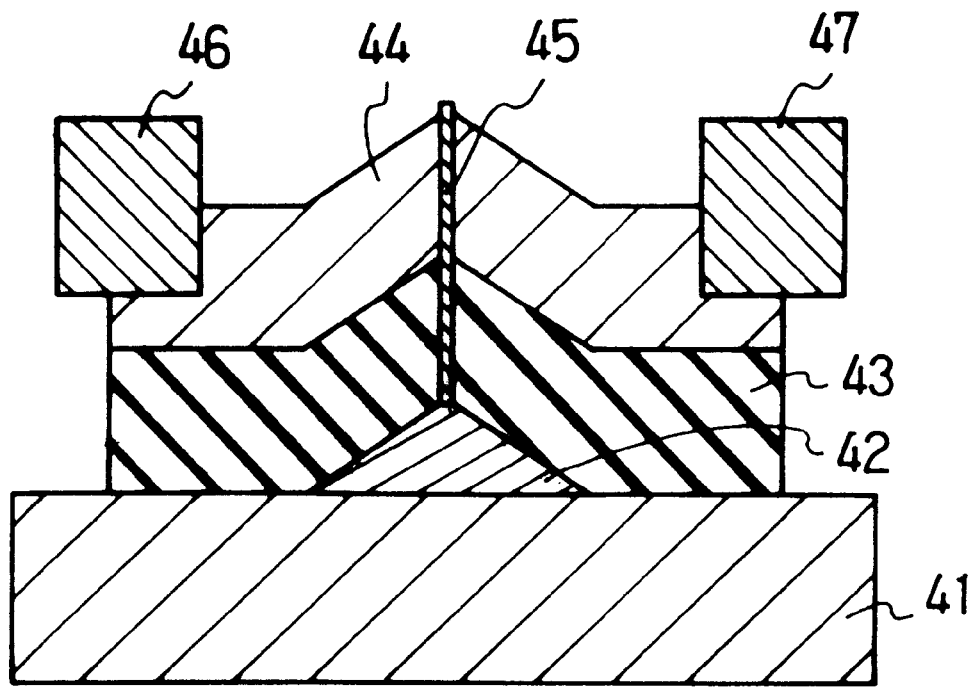
FIG. 4 is a cross-sectional view of a superconducting device in a second embodiment of the invention.

Next, a superconducting device in the second embodiment of this invention is described in the following. FIG. 4 shows a cross-section of a superconducting device in the second embodiment of this invention. A superconducting device in this embodiment is produced by the following steps.

First, a platinum thin film having a thickness of about 150 nm was deposited on the entire surface of the substrate 41 by sputtering at a temperature of 500° C. with the substrate 41 in an argon atmosphere of 60 m Torr (about 8.0 Pa). The deposited platinum thin film was oriented to the (100) crystal plane. Although the thickness of the platinum thin film was set to be about 150 nm in this embodiment, this is not a necessity, and any thickness of the platinum thin film on which another film can be properly formed is acceptable. That is, any thickness of the platinum film which provides adequate wettability is acceptable. Accordingly, the thickness of the platinum thin film may be, for example, about 80 nm.

Then, the platinum thin film was processed to become linearly shaped (a linear platinum thin film 42) of 1 $\mu$m in width and 10 $\mu$m in length by etching technique using photolithography and Ar ions. For example, MgO monocrystal substrate can be used as the substrate 41 described above.

Then, a $SrTiO_3$ thin film 43 having a thickness of 500 nm was formed on the platinum thin film, and then a $YBa_2Cu_3O_7$ oxide superconducting thin film 44 having a thickness of 100 nm was formed on the $SrTiO_3$ thin film 43, each by sputtering and by causing epitaxial growth. These thin films were formed at a temperature of 650° C. of the substrate 41 in an atmosphere of mixture of argon and oxygen of 40 m Torr (about 5.3 Pa).

Then, a superconducting bridge having a wiring pattern of 1 $\mu$m in width and 10 $\mu$m in length was formed by an etching technique using photolithography and Ar ions so that it became almost the same shape as shown in FIG. 2 and crossed the processed region (the processed convex region).

FIG. 4 shows a cross-section of a superconducting device produced by the above described processes. In FIG. 4, 41 is the substrate, 42 is the processed line shaped platinum thin film, 43 is the $SrTiO_3$ thin film, 44 is the $YBa_2Cu_3O_7$ oxide superconducting thin film, 45 is the grain boundary part, and 46 and 47 are electrodes. FIG. 4 shows the structure of an electric field effect device controlling superconducting current which flows into the grain boundary by electric field when the processed linear platinum thin film 42 is used as a gate electrode, the electrode 46 and the electrode 47 are used as a source electrode and a drain electrode, respectively, and the $SrTiO_3$ thin film 43 is used as a gate barrier.

That is, FIG. 4 shows a superconducting device in which the convex region (the processed line shaped platinum thin film) 42 of oriented metal is provided on the substrate 41 as a gate electrode, and an oxide insulating film (the $SrTiO_3$ thin film 43) is deposited on the convex region, and further the $YBa_2Cu_3O_7$ oxide superconducting thin film 44 is deposited on the oxide insulating film so that the grain boundary part 45 is formed on the convex region 42, and the drain electrode 46 and the source electrode 47 are formed facing each other with the grain boundary part 45 in between. In this device, conductance between the drain electrode 46 and the source electrode 47 was changed by applying voltage to the gate electrode (the platinum thin film 42). Accordingly, an electric field effect type device could be obtained.

According to the manufacturing method of a superconducting device in the embodiment as described above, the thickness and the characteristics of the channel layer of an electric field effect type device can be easily controlled so that the device can be easily produced.

Having described in this embodiment a process to form a gate electrode (the convex region 42) by an etching technique using photolithography and Ar ions as an example, it is to be understood that the invention is not limited to these processes. For example, the gate electrode part (the convex region 42) may be formed by applying electric field between the probe and the surface of the thin film substrate by using a scanning tunneling microscope.

What is claimed is:

1. A superconducting device comprising a substrate, a convex region formed on said substrate, an oxide film formed on said substrate and said convex region, and an oxide superconducting film formed on said oxide film, wherein said convex region has a triangular shape protruding from a section taken perpendicular to the plane of the substrate, and comprises oriented metal; and further wherein, the convex region has a height of about 10 nanometers.

2. The superconducting device as claimed in claim 1, wherein said oriented metal comprises platinum.

3. The superconducting device as claimed in claim 1, wherein said convex region is linearly shaped.

4. The superconducting device as claimed in claim 1, wherein said oxide film comprises an insulating film.

5. A superconducting device as claimed in claim 1, wherein said oxide film comprises an oxide compound selected from the group consisting of $Bi_2Sr_2CaCu_2O_x$, $Bi_2Sr_2CaCuO_y$ and $SrTiO_3$.

6. A superconducting device as claimed in claim 1, wherein said oxide film is in a polycrystalline state.

7. A superconducting device as claimed in claim 1, wherein said oxide film is in an amorphous state.

8. A superconducting device as claimed in claim 1, wherein said oxide superconducting film comprises an oxide compound selected from the group consisting of $Bi_2Sr_2CaCu_2O_x$ and $YBa_2Cu_3O_7$.

9. A superconducting device as claimed in claim 1, wherein said oxide superconducting film is in a polycrystalline state.

10. A superconducting device as claimed in claim 1, wherein said oxide superconducting film is formed by annealing a precursor of said film and wherein said precursor is in an amorphous state.

11. A superconducting device as claimed in claim 1, wherein said oxide film is formed by high temperature annealing.

12. A superconducting device as claimed in claim 1, wherein said oxide superconducting film is formed by high temperature annealing.

13. A superconducting device as claimed in claim 1, further comprising a grain boundary on said convex region.

14. A superconducting device as claimed in claim 13, further comprising a superconducting bridge across said convex region.

15. A superconducting device as claimed in claim 14, wherein said superconducting bridge is a wiring pattern.

16. A superconducting device as claimed in claim 14, wherein said grain boundary is a Josephson junction.

17. A superconducting device as claimed in claim 14, wherein said superconducting device shows current-voltage characteristics having Shapiro steps when microwave is irradiated to said superconducting device at a temperature of about 83 K.

18. A superconducting device as claimed in claim 1, further wherein the convex region extends beyond said plane of the substrate.

* * * * *

UNITED STATES PATENT AND TRADEMARK OFFICE
CERTIFICATE OF CORRECTION

PATENT NO. : 6,160,266

DATED : December 12, 2000

INVENTOR(S) : Odagawa, et al.

It is certified that error appears in the above-identified patent and that said Letters Patent is hereby corrected as shown below:

In Claim 5, line 4:

Change "$Bi_2Sr_2CaCuO_y$," to --$Bi_2Sr_2CuO_y$--

Signed and Sealed this

Eighth Day of May, 2001

Attest:

NICHOLAS P. GODICI

Attesting Officer    Acting Director of the United States Patent and Trademark Office